United States Patent [19]

Lo

[11] 4,415,860
[45] Nov. 15, 1983

[54] SINE WAVE TO TRIANGLE WAVE CONVERTOR

[75] Inventor: Kwok S. Lo, San Diego, Calif.

[73] Assignee: Wavetek, San Diego, Calif.

[21] Appl. No.: 245,995

[22] Filed: Mar. 20, 1981

[51] Int. Cl.³ .......................... H03K 5/00; H03K 4/10
[52] U.S. Cl. ..................................... 328/22; 307/228; 307/261; 328/181
[58] Field of Search ....................... 307/266, 228, 261; 328/181–185, 21

[56] References Cited

U.S. PATENT DOCUMENTS

| 3,633,043 | 1/1972 | Anothy | 307/228 |
| 4,045,713 | 8/1977 | Gota | 307/228 |
| 4,322,636 | 3/1982 | Schröder | 307/228 |

Primary Examiner—Stanley D. Miller
Assistant Examiner—B. P. Davis
Attorney, Agent, or Firm—Charles H. Schwartz; Ellsworth R. Roston

[57] ABSTRACT

A sine wave to triangle wave convertor, including an amplifier having an input terminal and an output terminal, a sine convertor having an input terminal and an output terminal and for producing a sine wave at the output terminal in accordance with the application of a triangle wave at the input terminal, the output terminal of the amplifier coupled to the input terminal of the sine convertor and the output terminal of the sine convertor coupled to the input terminal of the amplifier, and coupling an input sine wave to the input terminal of the amplifier to produce an output triangle wave at the output terminal of the amplifier.

10 Claims, 9 Drawing Figures

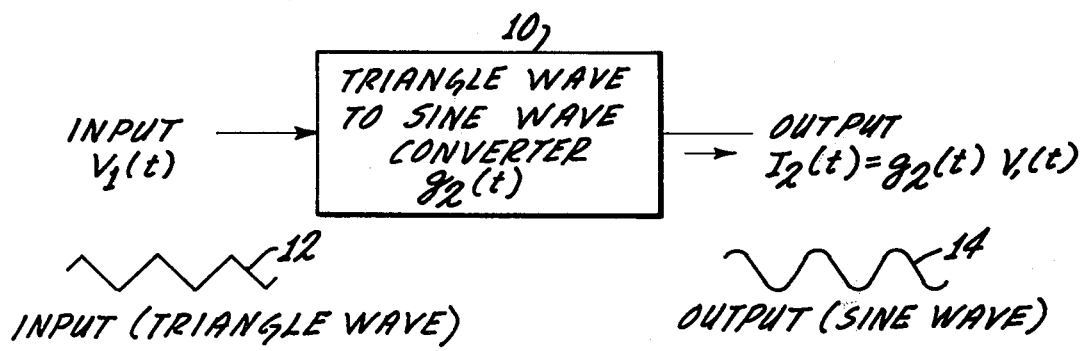
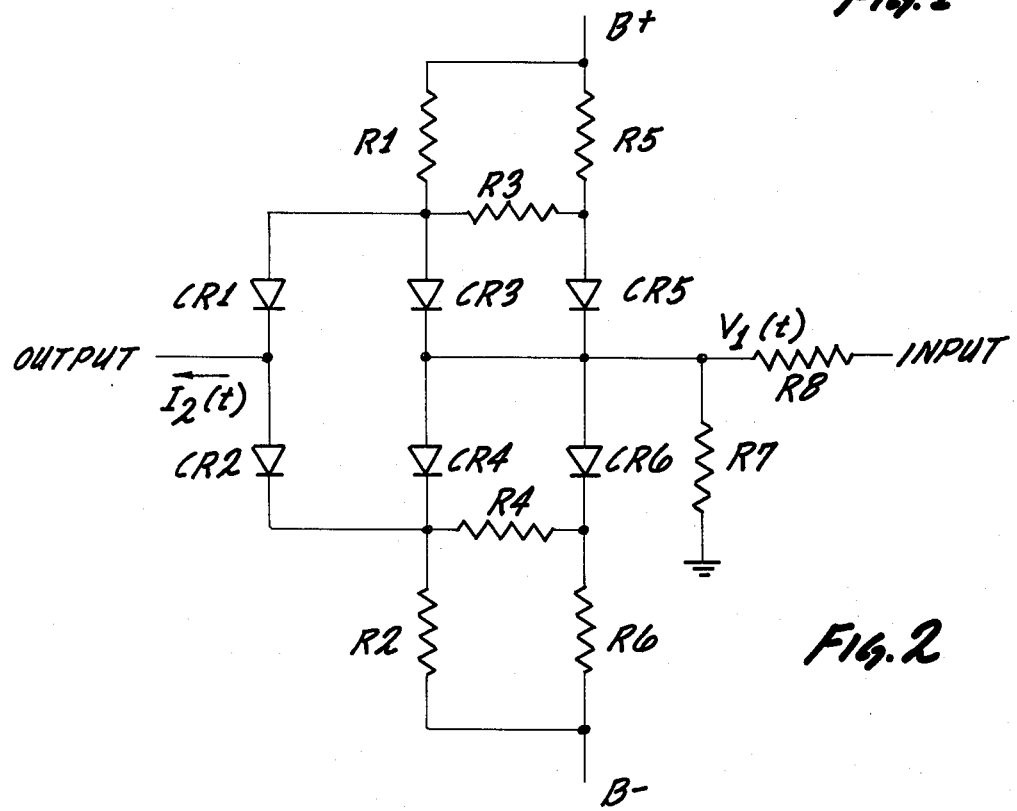
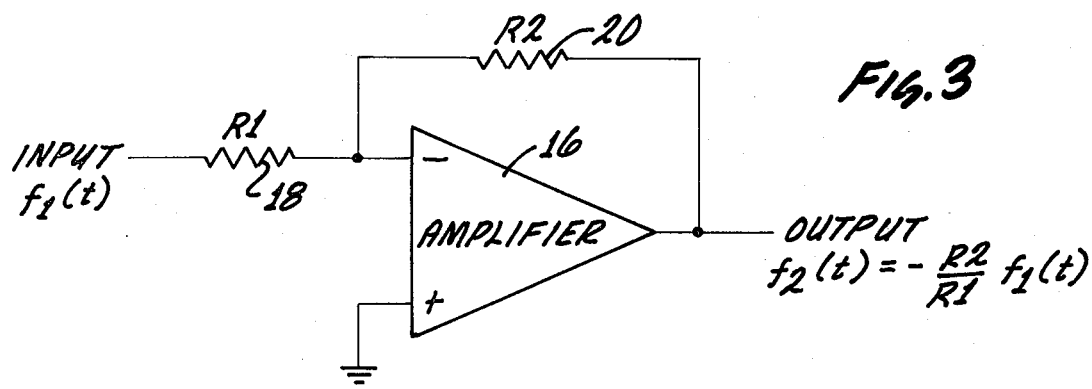

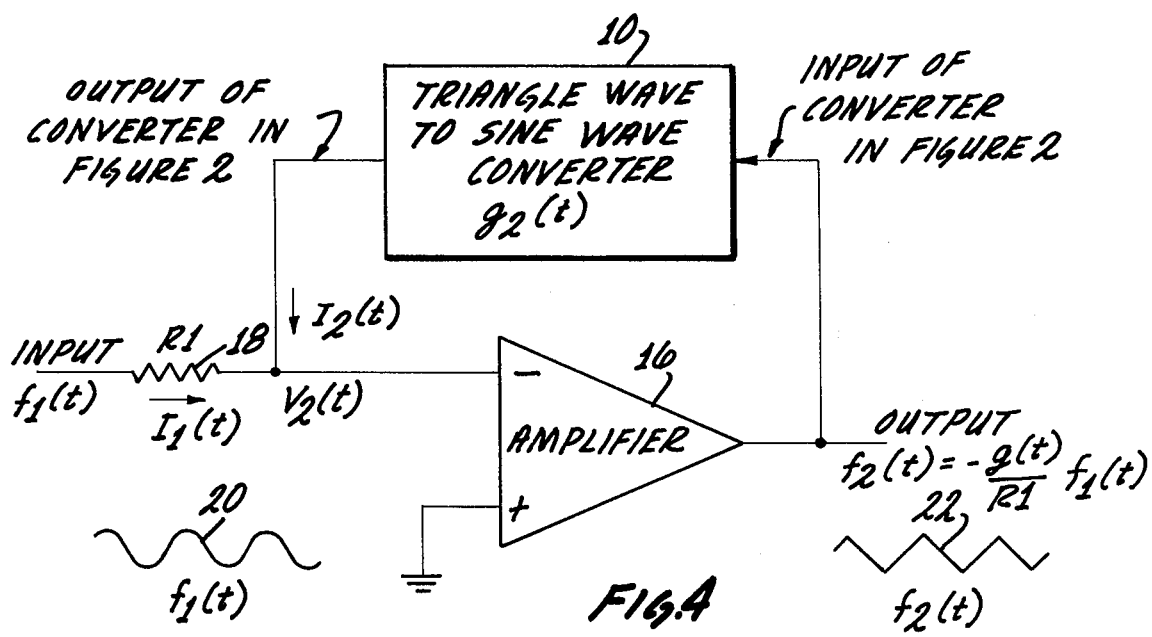
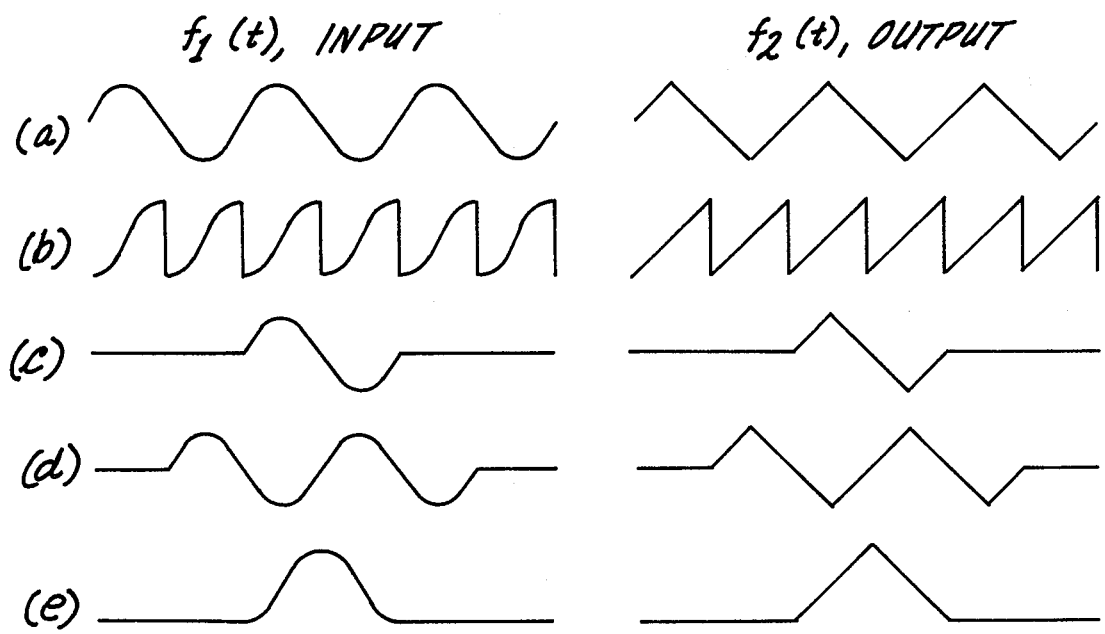

SINE WAVE TO TRIANGLE WAVE CONVERTOR

BACKGROUND OF THE INVENTION

1. Field of the Invention

The present invention relates to a sine wave to triangle wave converter and specifically to a system for producing a triangle wave from an existing sine wave.

2. Description of the Prior Art

In the prior art it is known to provide for a sine convertor, either formed from a passive or active electronic circuit, which converts a triangle waveform into a sine waveform. This type of sine convertor is mainly used as a part of a signal generator which supplies triangle, sine and square waveforms. Such a signal generator which generates these various waveforms has generally been called a function generator.

Sine convertors of the prior art which are used as part of a function generator initially generate the triangular waveform and square waveform; and with the triangular waveform then used to form the other waveform such as the sine waveform. As a specific example the triangular waveform may be generated by applying positive and negative current alternately to a timing capacitor. The current applied to the capacitor causes the voltage across the capacitor to rise or fall in accordance with the direction of current flow. The peak voltage to which the current rises before it reverses in direction is controlled by the use of peak detectors for the positive and negative peak points. The voltage across the capacitor therefore rises to a positive peak point and is then reversed down to the negative peak point and with this rise and fall alternating so as to produce a triangular waveform.

The triangular waveform produced in the prior art is then applied to a sine converter so that the triangular waveform may be shaped into a sine waveform. The sine convertor may be constructed in a number of different ways and as an example a combination of resistors and diodes may be used to form a nonlinear network so as to produce an output sine waveform in accordance with an input triangular waveform.

SUMMARY OF THE INVENTION

The present invention provides for a conversion of a sine wave to a triangle wave using the triangle wave to sine wave convertor of the prior art connected in the feedback loop of an amplifier. The sine wave to triangle wave convertor of the present invention is specifically used as part of a waveform synthesizer of a type which is replacing function generators as the source of waveforms.

Generally the waveform synthesizers now being constructed produce highly accurate synthesized sine and square waves for use in testing and design of electronic equipment. However, it would be desirable to also produce the triangular waveforms and other types of special waveforms which have been available in function generator. The present invention thereby fr provides for these other desirable waveforms and specifically for a triangle waveform which is produced from the synthesized sine waveform. The triangle waveform is uniquely produced by using a sine convertor connected in the feedback loop of an amplifier such as an operational amplifier. The present invention therefore produces the desirable triangular waveform in a simple and reliable method without the complexity of existing techniques of converting sine waves to triangle waves.

BRIEF DESCRIPTION OF THE DRAWING

A clearer understanding of the present invention will be had with reference to the following description and drawings wherein:

FIG. 1 is a block diagram of an existing sine convertor in which a triangle wave is shaped into a sine wave;

FIG. 2 is a particular sine convertor which may be used in the present invention and which is formed from a resistor diode network;

FIG. 3 illustrates a block diagram of a typical inverting amplifier;

FIG. 4 is a block diagram of an apparatus constructed in accordance with the teachings of the present invention using the sine convertor of FIG. 1 as part of the feedback path of the inverting amplifier of FIG. 3 and showing the input and output waveforms; and FIG. 5 illustrates a number of other waveforms that may be generated using the convertor apparatus of FIG. 4.

DESCRIPTION OF THE PREFERRED EMBODIMENT

In FIG. 1 a triangle wave to sine wave convertor 10 is shown to convert an input signal formed as a triangle wave 12 to an output signal formed as a sine wave 14. If the input triangular wave 12 has a voltage $V_1(t)$ the output sign wave 14 will have a current defined by the relationship:

$$I_2(t) = g_2(t) V_1(t)$$

where $g_2(t)$ equals the convertor transfer function for modifying the triangular wave 12 into the sine wave 14. The sine wave convertor 10 is generally known and may be constructed either from passive or active circuit elements. This type of sine convertor is generally used as part of a function generator so as to produce ouput sine waves from input triangle waves.

As a specific example as shown in FIG. 2 the sine convertor 10 in FIG. 1 may be formed from the network of resistors and diodes or other semiconductors and specifically including resistors R1 through R8 and diodes CR1 through CR6. The triangular input is applied to the input resistor R8 and with the sine wave output current through the diodes CR1 and CR2 producing the sine wave output current $I_2(t)$.

The sine convertor of FIG. 2 operates similarly to an amplitude attenuator except that since diodes are used for some of the attenuator elements and since the diodes are a nonlinear device, the attenuator function produced by the circuit of FIG. 2 will also be nonlinear. Specifically the particular values for the various elements of the circuit of FIG. 2 are chosen so as to produce a sine waveform output signal when a triangle waveform input signal is applied to the circuit.

FIG. 3 illustrates an existing type of inverting amplifier 16 formed by an operational amplifier and including an input resistance 18 having a value R1 and a feedback resistance 20 having a value R2. If a voltage $f_1(t)$ is applied to the input of the amplifier 16, then the output $f_2(t)$ of the amplifier will be:

$$f_2(t) = -(R2/R1) f(t) \qquad (1)$$

The present invention incorporates the existing triangle wave to sine wave convertor 10, such as shown in FIG. 1, as part of the inverting amplifier of FIG. 3 by replacing the feedback resistance 20 by the sine converter 10. As an example the specific sine convertor shown in FIG. 2 may be used. In particular, the input terminal of the sine convertor 10 is connected to the output of the amplifier 16 and with the output of the sine convertor 10 connected to the input summing junction of the amplifier 16. The input voltage $f_1(t)$ is the sine wave 20 and the output $f_2(t)$ is the triangle wave 22. The system of FIG. 4 therefore converts an input sine wave to an output triangle wave by connecting a sine convertor in the feedback loop of an inverting amplifier. This can generally be shown by the following: For the sine convertor shown in FIG. 1, $g_2(t)$ can be defined as:

$$I_2(t) = g_2(t) V_1(t) \tag{2}$$

where $I_2(t)$ is a current signal having a periodic sine wave $V_1(t)$ is a voltage signal having a periodic triangular wave $g_2(t)$ is the transfer function of the convertor 10.
In FIG. 4, $$I_2(t) = g_2(t) f_2(t) \tag{3}$$

$$I_1(t) = (1/R1) f_1(t) \tag{4}$$

$$I_1(t) + I_2(t) = 0 \tag{5}$$

therefore, $$I_1(t) = (1/R1) f_1(t) = -g_2(t) f_2(t) \tag{6}$$

It can be seen that by comparing the equation (6) to the equation (2), if $I_1(t)$ is a periodic sine wave, $f_2(t)$ must be a periodic triangular wave. Also because the input resistance 18 (R1) is a linear device then, $(f)_1(t)$ must be a periodic sine wave. In other words, the feedback current signal $I_2(t)$ is a sine wave which when combined with the current $I_1(t)$ produces a compensation so as to form a triangle wave for the input voltage signal $V_2(t)$ and the output voltage signal $f_2(t)$. The system of FIG. 4 therefore provides for the proper feedback being produced to automatically convert the input sine wave $f_1(t)$ to the output triangle wave $f_2(t)$.

It can be seen therefore that depending upon the particular waveform of the input sine wave a variety of output triangle waves may be formed. This can be seen with specific reference to FIG. 5 where a plurality of input and output waveforms (a) to (e) are shown. As can be seen waveform (a), shows the sine wave to triangular wave conversion Waveform (b) shows conversion from a half sine wave to a sawtooth output. Waveforms (c) and (d) show that any particular number of sine waves may be converted to a corresponding number of triangular waves. Waveform (e) illustrates the use of a baseline offset sine wave to produce a similar triangle wave.

The present invention therefore provides for a simple and reliable method of producing a triangle wave from an existing sine wave by utilizing a sine convertor connected in the feedback loop of an amplifier. Although the invention has been described with reference to a particular embodiment, it is to be appreciated that various adaptations and modifications may be made and the invention is only to be limited by the appended claims.

I claim:
1. A sine wave to triangle wave converter including
an amplifier having and input terminal and an output terminal,
a sine convertor having an input terminal and an output terminal and for producing a sine wave at the output terminal in accordance with the application of a triangle wave at the input terminal and with each cycle of the triangle wave producing a corresponding cycle of the sine wave and with each sloping portion of each cycle of the triangle wave producing a corresponding sine wave portion of the sine wave,
the output terminal of the amplifier coupled to the input terminal of the sine convertor and the output terminal of the sine convertor coupled to the input terminal of the amplifier, and
means coupled to the input terminal of the amplifier for coupling an input sine wave to the amplifier to produce an output triangle wave at the output terminal of the amplifier and with each cycle of the sine wave producing a corresponding cycle of the triangle wave and with each sine wave portion of the sine wave producing a corresponding sloping portion of the triangle wave.

2. The sine wave to triangle wave convertor of claim 1 wherein the amplifier is an inverting amplifier.

3. The sine wave to triangle wave convertor of claim 1 wherein the amplifier is an operational amplifier.

4. The sine wave to triangle wave convertor of claim 1 wherein the sine convertor is formed by a semiconductor resistor network.

5. The sine wave to triangle wave convertor of claim 1 wherein the input sine wave is less than one complete cycle to produce the output triangle wave of less than one complete cycle.

6. A sine wave to triangle wave convertor, including,
means for amplifying a signal between an input and output and including a feedback path between the output and input,
means for converting a triangle wave to a sine wave between an input and an output and with each cycle of the triangle wave producing a corresponding cycle of the sine wave and with each sloping portion of each cycle of the triangle wave producing a corresponding sine wave portion of the sine wave,
the means for converting forming at least part of the feedback path between the output and input of the amplifying means, and
means coupled to the input of the amplifying means for coupling a sine wave to the amplifying means to produce a triangle wave at the output of the amplifying means and with each cycle of the sine wave producing a corresponding cycle of the triangle wave and with each sine wave portion of the sine wave producing a corresponding sloping portion of the triangle wave.

7. The sine wave to triangle wave convertor of claim 6 wherein the amplifying means is an inverting amplifier.

8. The sine wave to triangle wave convertor of claim 6 wherein the amplifying means is an operational amplifier.

9. The sine wave to triangle wave convertor of claim 6 wherein the converting means is formed by a semiconductor resistor network.

10. The sine wave to triangle wave convertor of claim 6 wherein the sine wave coupled to the input of the amplifying means is less than one complete cycle to produce the triangle wave at the output of the amplifying means of less than one complete cycle.

* * * * *